US010108825B2

(12) United States Patent
Bienert

(10) Patent No.: US 10,108,825 B2
(45) Date of Patent: Oct. 23, 2018

(54) NFC READER WITH REMOTE ANTENNA

(71) Applicant: NXP B.V., Eindhoven (NL)

(72) Inventor: Renke Bienert, Handeloh (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/466,137

(22) Filed: Mar. 22, 2017

(65) Prior Publication Data

US 2018/0276426 A1    Sep. 27, 2018

(51) Int. Cl.
G06K 7/10      (2006.01)
H04B 5/00      (2006.01)
H03G 3/20      (2006.01)
H03H 7/01      (2006.01)

(52) U.S. Cl.
CPC ..... G06K 7/10148 (2013.01); G06K 7/10316 (2013.01); H03G 3/20 (2013.01); H03H 7/0115 (2013.01); H04B 5/0056 (2013.01)

(58) Field of Classification Search
CPC .................................................. G06K 7/10148
USPC ................. 235/439, 441; 455/77, 305, 41.1; 333/112
See application file for complete search history.

(56) References Cited

U.S. PATENT DOCUMENTS

| 6,560,299 | B1* | 5/2003 | Strolle | H04B 7/0848 |
| | | | | 375/232 |
| 8,314,653 | B1* | 11/2012 | Granger-Jones | H03F 1/223 |
| | | | | 327/552 |
| 9,236,771 | B2 | 1/2016 | Toncich et al. | |
| 9,240,811 | B2* | 1/2016 | Norholm | H04B 1/56 |
| 9,319,208 | B2* | 4/2016 | Khlat | H04B 1/525 |
| 9,654,181 | B1 | 5/2017 | Wobak et al. | |
| 9,893,715 | B2* | 2/2018 | Zachara | H03J 3/02 |
| 2007/0045418 | A1 | 3/2007 | Charrat et al. | |
| 2009/0243397 | A1 | 10/2009 | Cook et al. | |
| 2009/0280753 | A1* | 11/2009 | Philip | G01R 31/026 |
| | | | | 455/77 |
| 2009/0284220 | A1 | 11/2009 | Toncich et al. | |
| 2010/0321128 | A1* | 12/2010 | Merlin | G06K 7/0008 |
| | | | | 333/112 |

(Continued)

FOREIGN PATENT DOCUMENTS

JP          2014-230049 A1    12/2014

OTHER PUBLICATIONS

Non Final Office Action dated Jan. 12, 2018 for U.S. Appl. No. 15/425,105 6 pages.

Primary Examiner — Allyson Trail

(57) ABSTRACT

A near field communication (NFC) reader is disclosed. The NFC reader includes a first section. The first section includes an NFC controller and a filter coupled to the NFC controller. The filter includes a filter capacitor. The first section further includes a first tuning circuit coupled to the filter. The first tuning circuit includes a tuner capacitor that is electrically coupled in parallel to the filter capacitor. The first tuning circuit is configured and adapted to be coupled to a coaxial cable. The NFC reader also includes a second section. The second section includes a second tuning circuit. The second tuning circuit includes a second tuner capacitor and a damping resistor. The second tuning circuit is configured and adopted to be coupled to the coaxial cable. The second section further includes an antenna coupled to the second tuning circuit.

10 Claims, 2 Drawing Sheets

(56) References Cited

U.S. PATENT DOCUMENTS

| | | | | |
|---|---|---|---|---|
| 2010/0323635 | A1* | 12/2010 | Steeper | H04N 5/50 |
| | | | | 455/77 |
| 2013/0009722 | A1 | 1/2013 | White et al. | |
| 2013/0109305 | A1* | 5/2013 | Savoj | G06K 7/0008 |
| | | | | 455/41.1 |
| 2014/0285286 | A1* | 9/2014 | Bojer | H03H 7/0153 |
| | | | | 333/174 |
| 2015/0054345 | A1* | 2/2015 | Monat | H01F 38/14 |
| | | | | 307/104 |
| 2015/0070233 | A1* | 3/2015 | Nakamura | H01Q 7/06 |
| | | | | 343/788 |
| 2016/0242124 | A1* | 8/2016 | Zhou | G06K 7/0008 |
| 2016/0292560 | A1 | 10/2016 | Ayatollahi et al. | |
| 2016/0293025 | A1* | 10/2016 | Marr | G06Q 10/109 |
| 2016/0329638 | A1 | 11/2016 | Kanno | |
| 2017/0104468 | A1 | 4/2017 | Korman et al. | |

* cited by examiner

NFC READER WITH REMOTE ANTENNA

CROSS REFERENCE TO RELATED APPLICATIONS

This application is related to application Ser. No. 15/425,105, entitled "NFC READER WITH AUTO TUNER" filed on Feb. 6, 2017, which is being incorporated herein by reference in its entirety.

BACKGROUND

Wireless communication technologies, such as those used for NFC or ISO/IEC 14443 devices, communicate with each other via magnetic field induction in close distances or in close proximity. Each device features an antenna. The primary device ("reader" or "initiator") generates the magnetic field which can be used to power secondary devices like passive transponders. Modulation schemes applied to the magnetic fields are used for communication purpose between the devices.

The primary device uses a transmitter to generate the emitted radio frequency (RF) field. A matching circuitry is used to transform and adapt the antenna impedance to the emitting device's transmitter. A low ohmic matching impedance is generally used for increased power transmission.

One limiting factor on the operating distance side is the emitted RF power of the primary device. Applications like contact-less payment systems require a specific operating distance. As the primary device's antenna size is often a constraint to the product, high output power transmitters are required.

The primary and secondary devices form a coupled wireless resonant circuit. If the coupling between the components is increased, the primary resonant circuit will be loaded and detuned. This results in a different load impedance seen by the primary device's transmitter, possibly causing an increased driver current and increased RF field emission. Regulatory bodies and RF standards limit the maximum allowed emitted RF power. Therefore, non-compliance of the application system can occur in case of detuning. Furthermore, increased current consumption can be linked to device damage and reduced user experience in case of battery powered devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a near field communication (NFC) reader is disclosed. The NFC reader includes a first section. The first section includes an NFC controller and a filter coupled to the NFC controller. The filter includes a filter capacitor. The first section further includes a first tuning circuit coupled to the filter. The first tuning circuit includes a tuner capacitor that is electrically coupled in parallel to the filter capacitor. The first tuning circuit is configured and adapted to be coupled to a coaxial cable. The NFC reader also includes a second section. The second section includes a second tuning circuit. The second tuning circuit includes a second tuner capacitor and a damping resistor. The second tuning circuit is configured and adapted to be coupled to the coaxial cable. The second section further includes an antenna coupled to the second tuning circuit. Note that the first tuning circuit includes a first cable connector and the second tuning circuit includes a second cable connector. During deployment, the first section and the second section are coupled using a cable (such as a coaxial cable). In some embodiments, the first section and the second section are configured and adapted to be coupled together through the first cable connector and the second cable connector only.

In some embodiments, the filter is an electromagnetic compatibility (EMC) low pass filter having an asymmetrical component structure in which two transmission lines are coupled together, and the value of the tuner capacitor depends on a length of the coaxial cable. The value of the tuner capacitor is configured to match an impedance between a transmission line of the NFC controller and ground with an impedance of the coaxial cable. The NFC controller includes a dynamic power control (DPC) unit to limit a current drawn by the NFC controller to a preselected maximum value. The DPC unit employs automatic gain control (AGC) and the NFC controller is configured to increase the AGC value when the current drawn by the NFC controller is increased, to decrease the current drawn by the NFC controller and to decrease transmission power. The EMC filter includes a filter inductance and the antenna includes an antenna inductance. The filter inductance is greater than one half of the antenna inductance. The first section and the second section are configured and adapted to be coupled together through the coaxial cable only.

The terms "symmetrical tuning" and "asymmetrical tuning" as used herein refer to the representation of the variations in impedance on a smith chart. A different EMC filter cut-off frequency may cause the antenna impedance curve to be represented either symmetrically or asymmetrically on capacitive and inductive sides on a smith chart.

BRIEF DESCRIPTION OF THE DRAWINGS

So that the manner in which the above recited features of the present disclosure can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered as limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

Typically, a near field communication (NFC) driver chip includes two transmission lines (opposite phase transmission on each line) and two receiver lines to provide a balanced circuit. A typical NFC reader includes a NFC driver chip, a filter, a tuning circuit and an antenna coil on a same printed circuit board (PCB) or at least the antenna coil being physically and immovably close to the rest of the circuit. However, when a remote antenna coil is desired, the antenna coil is connected to the remaining circuit through a cable of a certain length. It is not desirable to have two such cables connected to each of the transmission lines. Hence, in such cases, the NFC reader circuit must be designed to have an unbalanced circuit having only one transmission line and one receiver line.

A typical NFC Reader antenna design does not allow to separate the antenna far from the NFC chip without a major performance impact. Especially for payment applications (e.g., Point of Sale terminal design) a separated antenna can only be realized with a 50Ω (for example) coaxial cable, and requires to exhibit the same performance as in the standard "on the same PCB" antenna design. The detuning and loading effects have so far been compensated either by a high impedance or a very low Q-factor and therefore end up in a low power level.

One or more embodiments described herein use an NFC chip with Dynamic Power Control (DPC). DPC is described in application Ser. No. 14/881,095 filed on Oct. 12, 2015 and application Ser. No. 14/968,788 filed on Dec. 14, 2015, both are incorporated herein by reference.

DPC increases the range by adjusting power levels and also protects the NFC chip from over current that may occur when impedance changes occur due to coupling of the NFC reader antenna with a load (e.g., a reader card or a mobile device with NFC features). However, conventionally, the DPC is limited to balanced antenna designs requiring a "symmetric" tuning.

Figure 1:
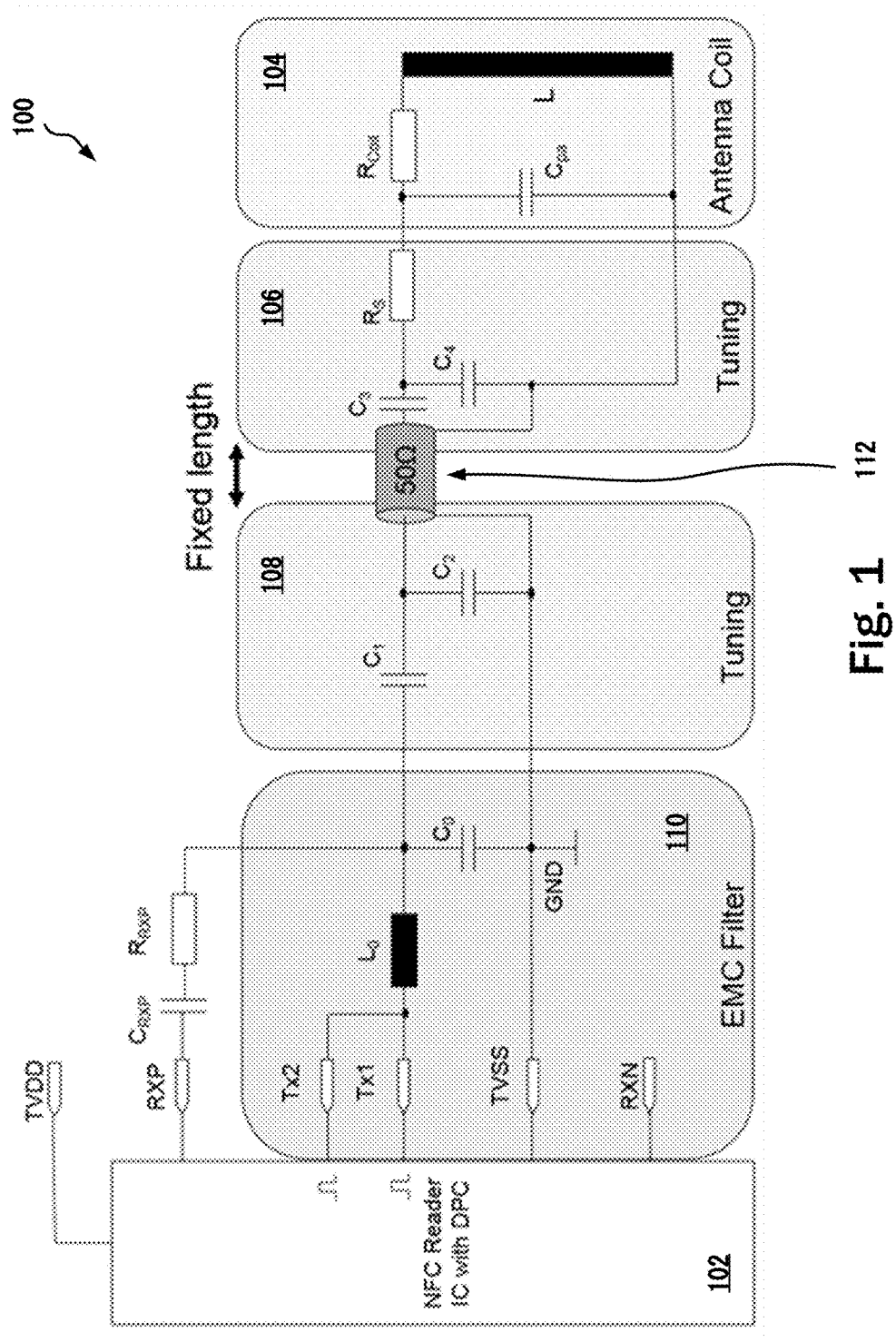
FIG. 1 depicts a schematic circuit diagram of a near field communication (NFC) reader in accordance with one or more embodiments of the present disclosure.

FIG. 1 depicts a schematic circuit diagram of a near field communication (NFC) reader 100. The NFC reader 100 includes a NFC reader controller 102 and an antenna tuning circuit that includes an electromagnetic compatibility (EMC) low pass filter 110, tuners (including tuning circuitry) 106, 108, and an antenna circuit 104 including a coil L. The antenna circuit 104 may also include a resistor $R_{coil}$ and a capacitor $C_{pa}$. Note however that the resistor $R_{coil}$ and the capacitor $C_{pa}$ might be not independent components in that the capacitor $C_{pa}$ may be representing internal resistance and capacitance of the coil L. The tuner 106 is coupled to the tuner 108 through a cable (e.g., a coaxial cable) 112. It should be noted that the cable 112 may be incorporated in the NFC Reader 100 when the NFC Reader 100 is installed for actual use in the field. Moreover, the cable impedance 50Ω shown in FIG. 1 is merely for example only. The embodiments described herein may be used with cables of impedances other than 50Ω.

The EMC low pass filter 110 is typically a second order low pass filter that includes an inductor L0 and a capacitor C0. A damping resistor Rs may be included to adjust the Q-factor of the antenna circuit 104. Typically, a balanced circuitry is used to increase the transmission power and to reduce unwanted radiations. The balanced circuitry includes two transmitter lines Tx1 and Tx2 and two receiver lines RXP and RXN. However, in this embodiment, the NFC reader controller 102 is configured to transmit signals on Tx1 and Tx2 in-phase and Tx1 and Tx2 are coupled together to form only one transmission line. Similarly, RXN and RXP may also be coupled together to form only one receiver line that includes a capacitor $C_{RXP}$ and a resistor $R_{RXP}$.

The antenna circuit 104 may be tuned in an asymmetrical tuning or symmetrical tuning. The asymmetrical tuning uses the EMC filter 110 with a cut-off frequency typically in the range of 17-21 MHz. For standard NFC applications, the NFC reader antenna is tuned to an impedance of 17-30Ω. Accordingly, the field current at TVDD=5V (TVDD is the voltage that drives or powers the NFC reader controller 102) is approximately in the range of 100-200 mA. The antenna 104 impedance increases when the antenna 104 is loaded either with an NFC card or a smartphone. The stronger the coupling between the NFC card or the smartphone with an NFC component and the antenna 104, the higher the antenna impedance and the lower the output power. This loading prevents the power consumption from exceeding the power consumption limitation of the NFC controller 102 and limits the power transfer level at low operating distances to stay within the EMVCo, NFC and ISO/IEC14443 specifications.

The symmetrical tuning includes the use of the EMC filter 110 with a cut-off frequency typically in the range of 14.3-14.7 MHz. The symmetrical tuning also matches the antenna 104 to the impedance typically in the range of 17-30Ω which causes a field current typically in the range of 100-200 mA.

The symmetrical tuning with a lower EMC cut-off frequency has an advantage in the power transfer range due to the improved transfer function of this type of tuning. With the symmetrical tuning a higher Q-factor can be used, and the field strength can be typically up to 25% higher with the same input power.

In case of the antenna detuning (e.g., due to load coupling), the symmetrical antenna tuning behaves differently from the asymmetrical tuning. During the loading, the impedance of the antenna circuit 104 may decrease down to even less than 50Ω. This drop in impedance increases the field strength as well as the power consumption of the NFC reader controller 102, and might easily exceed the given limits as defined in the EMVCo, NFC and ISO/IEC14443 specifications.

The 50Ω (for example) single ended NFC antenna 104 is connected to the cable 112 of a preselected fixed length. The tuning circuit 106 includes capacitors C3 and C4. The capacitors C3 and C4 may be used for tuning the antenna 104 to match the impedance of the cable 112 under normal loading condition. As indicated earlier, the output drivers of the NFC reader controller 102 operate in phase (and not in opposite phase as in a typical balanced network), which allows to directly connect both output drivers to drive a single ended EMC filter 110. The cutoff frequency of the EMC filter 110 may be adjusted with L0 and C0 (as shown in the equation below), to be slightly above an operating frequency, but below the second harmonic. In some embodiments, it is desirable to have the cutoff frequency between 14.5 to 15 Mhz.

$$f_{cutoff} = \frac{1}{2\pi\sqrt{L_0 * C_0}}$$

For the tuning to 50Ω unbalanced only a single serial capacitor C1 is required to match the 50Ω antenna (directly or via the cable 112) to the required impedance of the unbalanced transmitter output. Once again, the value 50Ω is being used as an example only.

In the tuner or tuning circuit 108, an additional parallel capacitor C2 is incorporated. The capacitor C2 in combination with C0 and C1 allows to adjust the impedance for a required cable length. For example, the value of the capacitor C2 may be different for a different length of the cable 112. Using the capacitor C2, the impedance measured between the transmitter line and ground (GND) can be tuned symmetrically, thus allowing the DPC unit to operate effectively. It should be noted that that the capacitor C2 may be a fixed value capacitor or a variable capacitor. In embodiments where a variable capacitor is used, the same NFC reader may be used for different length cables 112.

The combination of C0 and C1 allows to combine the requirements of having a desired cut off frequency (between the operating frequency of the NFC reader 100 and the second harmonic) as well as matching the 50Ω impedance of the antenna 104 (via the cable 112) to the required impedance between TX and GND.

An appropriate capacitance value of the capacitor may be determined using a network vector analyzer (for example) to obtain a desired Smith chart for a given capacitor value. By choosing a value of the capacitor C2, the impedance is tuned to a value that allows to drive a high transmitter power level. This power level and the corresponding supply current ITVDD (the current the NFC reader controller 102 draws from TVDD voltage source) is close to the maximum power limit of the NFC reader controller 102 can withstand. The value of the capacitor C2 is determined by varying the value of C2 during design tests until an optimal value is found.

The unbalanced impedance requirement can be calculated as follows. Instead of 2 TX outputs in serial each requiring yΩ, the unbalanced solution drives the impedances in parallel. Hence, if $Z_{balanced}=2 \times y\Omega$, then $Z_{unbalanced}=y\Omega/2$.

In a typical EMVCO point of sale (POS) NFC reader, $Z_{unbalanced} \approx 5\Omega$, which results in ITVDD=170 mA, if TVDD=5V. These values correspond to $Z_{balanced} \approx 20\Omega$, which is the typical impedance of standard NFC Readers with balanced antennas.

The DPC unit is configured to adjust automatic gain control (AGC) based on the transmission field strength. A voltage level at RXP (e.g., the receiver input) is indicative of the transmission field strength because RXP is coupled to the transmission line. In some embodiments, an analog dynamic power control mechanism may be employed in which TVDD is changed inversely to the changes in the voltage at RXP to keep ITVDD below a preselected threshold. In other embodiments, a digital dynamic power control mechanism may be used. In the digital DPC mechanism, a plurality of operating modes are defined. Each of these operating modes includes a maximum threshold power level ($P_{Max}$) and a fall back power level ($P_{Fall}$). $P_{Fall}$ is smaller in value than $P_{Max}$. These power levels pertain to the transmission field strength. Different power modes may have different values of $P_{Max}$ and $P_{Fall}$. The DPC unit switches from one power mode to another power mode when the transmission strength exceeds $P_{Max}$ of a power mode or goes below $P_{Fall}$ of the power mode the DPC unit is presently operating in. In the process of the power mode switching, the DPC unit adjusts AGC and TVDD to reduce the transmission power level to $P_{Fall}$ of the power mode the DPC unit is switching to. The DPC unit stays in a particular power mode until the transmission power level exceeds $P_{Max}$ of that power mode or goes below $P_{Fall}$ of that power mode. This dynamic power control mechanism ensures that the transmission field strength never exceeds a preselected maximum value or never goes below a preselected minimum value. Note that the transmission field strength or transmission power level may vary due to the antenna detuning when the antenna 104 is coupled to a load.

As described above, when the transmission power level exceeds $P_{Max}$, the transmission power level is reduced to $P_{Fall}$ and when the transmission power level goes below $P_{Fall}$, the transmission power level is increased to a predefined higher value that is below $P_{Max}$ of the next power mode in which the DPC unit would be making a transition into. The time period of reducing the transmission power level to $P_{Fall}$ or increasing the transmission power level to the predefined higher value may be configured. That is how quick a switch to $P_{Fall}$ would occur can be configurable in the DPC unit.

For the digital dynamic power control mechanism described above, a precondition is that the supply current ITVDD should change linearly with the changes in the AGC. To ensure a proper dynamic power control operation, a "symmetric" tuning is used to tune the antenna 104. The value of the inductor $L_0$ is greater than the half of the antenna inductance (L).

Figure 2:
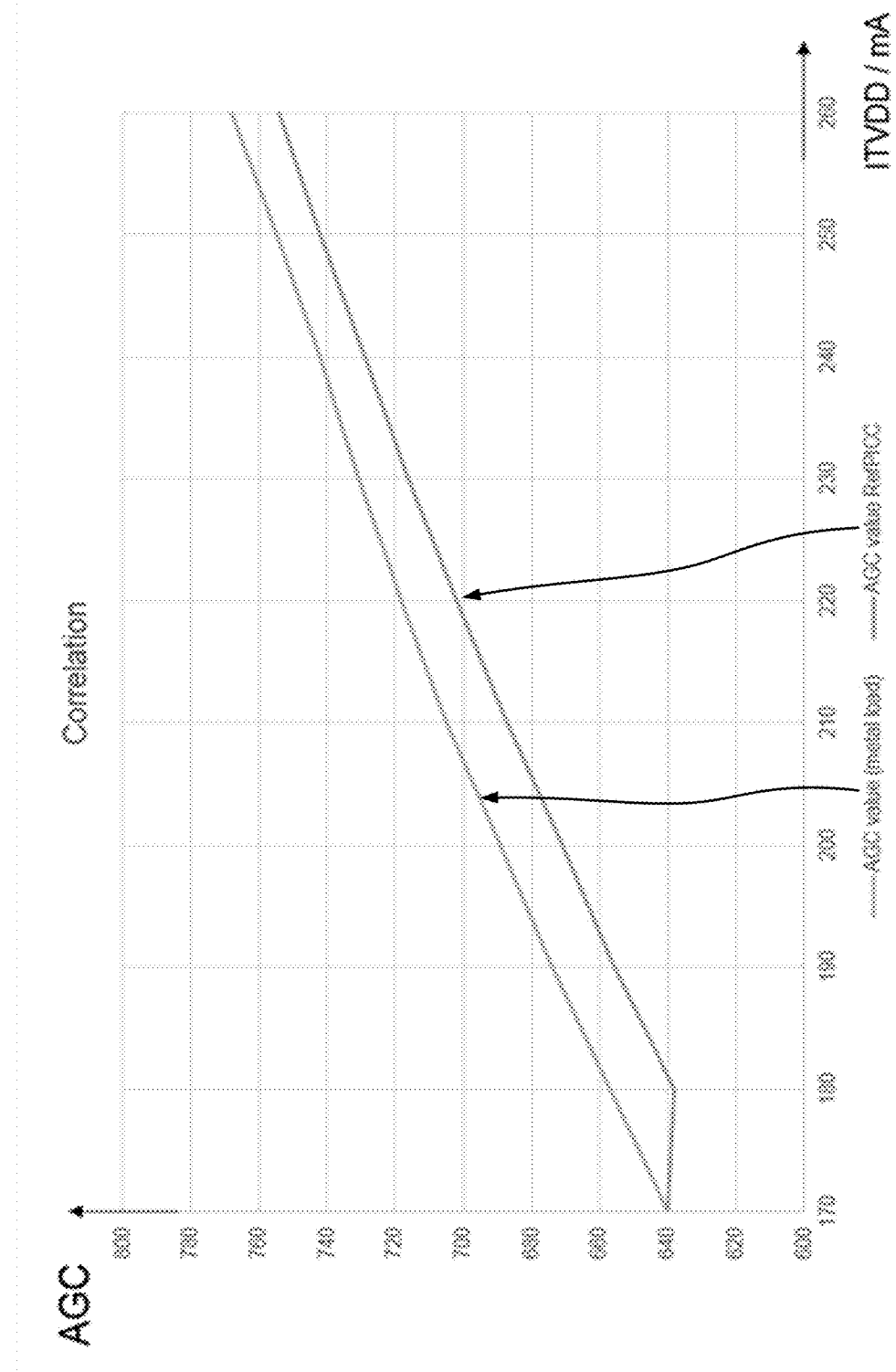
FIG. 2 shows a correlation between AGC (Rx voltage) and ITVDD (supply current) of the 50Ω antenna in accordance with one or more embodiments of the present disclosure.

Due to the "symmetric" tuning (e.g., the tuning that produces a symmetric Smith chart) any kind of detuning or loading changes the antenna impedance towards a lower impedance in such a way that the voltage level at the receiver (Rx) of the NFC reader controller 102 correlates to ITVDD. This linearity of changes or correlation between the Rx voltage level, which is measured, for example, as the AGC value or transmission signal power/strength, and the TX supply current ITVDD is required to calibrate and operate the DPC unit. An example of such linearity is shown in FIG. 2 which depicts a correlation or linearity between the changes in AGC value and the changes in the NFC reader controller 102 current (e.g., ITVDD). Two linear lines shown in FIG. 2 depicts the linearity of the changes in ITVDD with the changes in the AGC value for two different types of loads.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A near field communication (NFC) reader comprising,
a first section;
a second section;
wherein the first section includes
an NFC controller;
a filter coupled to the NFC controller, wherein the filter includes a filter capacitor;
a first tuning circuit coupled to the filter, wherein the first tuning circuit includes a tuner capacitor that is electrically coupled in parallel to the filter capacitor, wherein the first tuning circuit includes a first cable connector adapted to receive a first end of a coaxial cable;
wherein the second section includes
a second tuning circuit, wherein the second tuning circuit includes a second tuner capacitor and a damping resistor, wherein the second tuning circuit includes a second cable connector adapted to receive a second end of the coaxial cable; and
an antenna coupled to the second tuning circuit.

2. The NFC reader of claim 1, wherein the filter is an electromagnetic compatibility (EMC) low pass filter having an asymmetrical component structure in which two transmission lines are coupled together.

3. The NFC reader of claim 2, wherein the EMC filter includes a filter inductance and the antenna includes an antenna inductance, wherein the filter inductance is greater than one half of the antenna inductance.

4. The NFC reader of claim 1, wherein the value of the tuner capacitor is selected based on a preselected length of a cable to be connected between the first cable connector and the second cable connector.

5. The NFC reader of claim 4, wherein the value of the tuner capacitor configured to match an impedance between a transmission line of the NFC controller and ground with an impedance of the coaxial cable of the preselected length to be connected between the first cable connector and the second cable connector.

6. The NFC reader of claim 5, wherein the NFC controller includes a dynamic power control (DPC) unit to limit a current drawn by the NFC controller to a preselected maximum value.

7. The NFC reader of claim 6, wherein the DPC employs automatic gain control (AGC) and the NFC controller is configured to increase the AGC value when the current drawn by the NFC controller is increased, to decrease the current drawn by the NFC controller and to decrease transmission power.

8. The NFC reader of claim 1, wherein the first section and the second section are configured and adapted to be coupled together through the first cable connector and the second cable connector only.

9. A near field communication (NFC) reader comprising,
a first section;
a second section;
wherein the first section includes
an NFC controller;
a filter coupled to the NFC controller, wherein the filter includes a filter capacitor;
a first tuning circuit coupled to the filter, wherein the first tuning circuit includes a tuner capacitor that is electrically coupled in parallel to the filter capacitor, wherein the first tuning circuit includes a first cable connector, wherein the value of the tuner capacitor is selected based on a preselected length of a cable to be connected between the first cable connector and the second cable connector;
wherein the second section includes
a second tuning circuit, wherein the second tuning circuit includes a second tuner capacitor and a damping resistor, wherein the second tuning circuit includes a second cable connector; and
an antenna coupled to the second tuning circuit.

10. A near field communication (NFC) reader comprising,
a first section;
a second section;
wherein the first section includes
an NFC controller;
a filter coupled to the NFC controller, wherein the filter includes a filter capacitor;
a first tuning circuit coupled to the filter, wherein the first tuning circuit includes a tuner capacitor that is electrically coupled in parallel to the filter capacitor, wherein the first tuning circuit includes a first cable connector;
wherein the second section includes
a second tuning circuit, wherein the second tuning circuit includes a second tuner capacitor and a damping resistor, wherein the second tuning circuit includes a second cable connector; and
an antenna coupled to the second tuning circuit;
wherein the first section and the second section are configured and adapted to be coupled together through the first cable connector and the second cable connector only.

* * * * *